United States Patent
Xiong (10) Patent No.: US 7,952,444 B2
(45) Date of Patent: May 31, 2011

(54) CMOS POWER OSCILLATOR WITH FREQUENCY MODULATION

(75) Inventor: Yong Zhong Xiong, Singapore (SG)

(73) Assignee: Agency for Science, Technology and Research, Centros (SG)

( * ) Notice: Subject to any disclaimer, the term of this patent is extended or adjusted under 35 U.S.C. 154(b) by 120 days.

(21) Appl. No.: 12/376,652

(22) PCT Filed: Aug. 8, 2006

(86) PCT No.: PCT/SG2006/000225
§ 371 (c)(1),
(2), (4) Date: Mar. 12, 2009

(87) PCT Pub. No.: WO2008/018832
PCT Pub. Date: Feb. 14, 2008

(65) Prior Publication Data
US 2009/0315630 A1  Dec. 24, 2009

(51) Int. Cl.
*H03B 1/02* (2006.01)
(52) U.S. Cl. ............. 331/108 C; 331/36 L; 331/117 FE; 331/181
(58) Field of Classification Search ........ 331/36 L, 331/108 C, 117 FE, 117 R, 167, 181
See application file for complete search history.

(56) References Cited

U.S. PATENT DOCUMENTS

| | | | |
|---|---|---|---|
| 4,977,380 A * | 12/1990 | Martin et al. ............ 331/74 |
| 6,437,653 B1 | 8/2002 | Cruz et al. |
| 6,452,249 B1 | 9/2002 | Maeda et al. |
| 6,531,929 B2 | 3/2003 | Forbes |
| 6,621,365 B1 * | 9/2003 | Hallivuori et al. ........ 331/179 |
| 6,680,518 B2 | 1/2004 | Forbes |
| 6,963,307 B2 | 11/2005 | Mohamadi |
| 7,268,634 B2 * | 9/2007 | Luong et al. ........... 331/36 L |
| 2002/0049042 A1 | 4/2002 | Oida et al. |
| 2005/0140456 A1 | 6/2005 | Krishnasamy Maniam et al. |

FOREIGN PATENT DOCUMENTS

EP  1 536 553 A1  6/2005

OTHER PUBLICATIONS

Nam-Jin Oh et al., "11-GHz CMOS Differential VCO With Back-Gate Transformer Feedback", IEEE Microwave and Wireless Components Letters, vol. 15, No. 11, Nov. 2005, pp. 733-735.
PCT/ISA/210.
PCT/IPEA/409.

* cited by examiner

*Primary Examiner* — Levi Gannon
(74) *Attorney, Agent, or Firm* — Buchanan Ingersoll & Rooney PC (57) ABSTRACT

CMOS power oscillator and a method of frequency modulating a CMOS power oscillator. The oscillator comprises a transformer-based feedback CMOS power oscillator circuit formed on a chip-substrate, the oscillator circuit including a transformer coupled to a transistor; means for modulating the capacitance of the transformer to the chip-substrate for frequency modulating an output of the power oscillator.

17 Claims, 8 Drawing Sheets

CMOS POWER OSCILLATOR WITH FREQUENCY MODULATION

FIELD OF INVENTION

The present invention relates broadly to a complementary metal oxide semiconductor (CMOS) power oscillator with frequency modulation, and to a method of frequency modulating a CMOS power oscillator.

BACKGROUND

The rapidly growing market of personal communication systems, radio medical implanted systems, and wireless hearing aids provides an increasing demand for more integrated and more efficient radio frequency (RF) integrated circuits (IC's). These IC's are required to operate with supply voltages under 2V and sometimes down to 1V with minimum current consumption at frequencies up to several GHz. Such applications typically contain a combination of several modules including a power amplifier, an oscillator, for example a voltage controlled oscillator (VCO), and modulator.

For example Class E power amplifier circuits are very suitable for high efficiency power amplification applications in the radio-frequency and microwave ranges. However, due to the inherent asymmetrical driving arrangement, existing Class E amplifier circuits suffer significant harmonic contents in the output voltage and current, and usually require substantial design efforts in achieving the desired load matching networks for applications requiring very low harmonic contents.

The basic Class E circuit is typically implemented using discrete components including a transistor, which is connected with an RFC to the supply voltage and to the load network. The load network is made up of a capacitor shunting the transistor and a series tuned inductor capacitor resonant circuit. The transistor is driven hard enough to act like a switch. The principle of Class E power amplifiers is to avoid by design the simultaneous existence of high voltage and high current in the switch, even in the case of a long switching time. That would imply 100% efficient conversion of dc to RF energy.

Frequency modulation is typically implemented via a varactor and is based on an LC-tank circuit. However, this requires additional discrete components to match the load network resulting in lower power efficiency. Typical solutions include using two identical resonant circuits, which encounters the same problem of matching inductors and capacitors, as well as using symmetrically driven push-pull Class E amplifier for high power applications.

A need therefore exist for providing an alternative oscillator design with frequency modulation capability, which seeks to address one or more of the above mentioned problems.

SUMMARY

In accordance with a first aspect of the present invention there is provided a CMOS power oscillator comprising a transformer-based feedback CMOS power oscillator circuit formed on a chip-substrate, the oscillator circuit including a transformer coupled to a transistor; means for modulating the capacitance of the transformer to the chip-substrate for frequency modulating an output of the power oscillator.

The means for modulating may comprise a patterned ground shield (PGS) layer formed in the chip-substrate and coupled to an input circuit for receiving a modulating signal.

The power oscillator may further comprise a conducting layer formed in the chip-substrate for shielding the PGS layer and the transformer.

The input circuit may comprise a MOS FET.

The modulating signal may alternately set the PGS to floating and to grounding for modulating the capacitance of the transformer to the chip-substrate for frequency modulating an output of the power oscillator.

The means for modulating may comprise a deep N-well formed in the chip-substrate and coupled to an input circuit for receiving of a modulating signal.

The deep N-well may comprise a p-n junction.

The modulating signal may alternate the p-n junction capacitance and resistance for modulating the capacitance of the transformer to the chip-substrate for frequency modulating an output of the power oscillator.

The oscillator circuit may further include a variable capacitance coupled between an output terminal of the power oscillator and ground for varying an output carrier frequency of the power oscillator.

The variable capacitor may comprise a varactor for implementing a voltage controlled oscillator (VCO) with frequency modulation capabilities.

The transformer may provide a feedback path between the drain and the gate of the transistor.

A first port of the transformer may be connected for RF grounding and drain bias feeding, and a second port of the transformer is connected for RF grounding an gate bias feeding.

A third port of the transformer may be connected to the drain of the transistor, and a fourth port of the transformer is connected to the gate of the transistor.

Parameters of the transistor and parameters of the transformer may be chosen to pre-set the output carrier frequency of the power oscillator.

In accordance with a second aspect of the present invention there is provided a method of frequency modulating a CMOS power oscillator, the method comprising providing a transformer-based feedback CMOS power oscillator circuit formed on a chip-substrate, the oscillator circuit including a transformer coupled to a transistor; and modulating the capacitance of the transformer to the chip-substrate for frequency modulating an output of the power oscillator.

BRIEF DESCRIPTION OF THE DRAWINGS

Embodiments of the invention will be better understood and readily apparent to one of ordinary skill in the art from the following written description, by way of example only, and in conjunction with the drawings, in which:

FIGS. 1 (*a*) and (*b*) show a circuit schematic and a die microphotograph respectively of a CMOS process technology oscillator with FM modulation.

DETAILED DESCRIPTION

Figure 1:
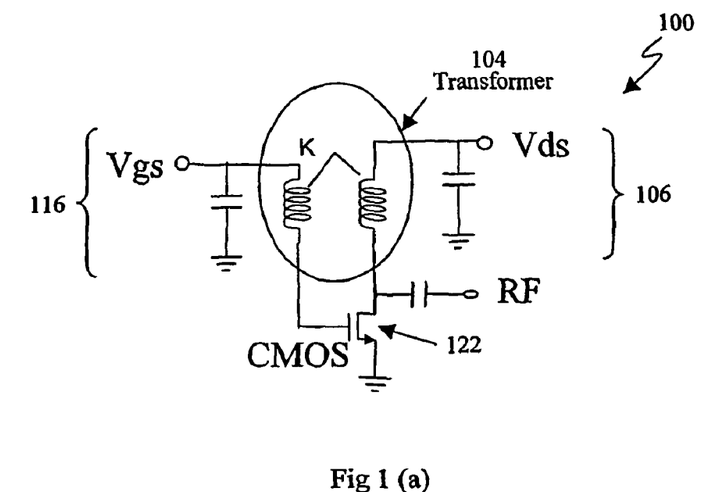

FIGS. 1 (a) and (b) show a circuit schematic and a die microphotograph respectively of an on-chip power oscillator structure 100. The structure 100 is fabricated using a conventional 0.18 μm CMOS process technology, with six metal TiW/Al-1% Si/TiW interconnects on a lossy silicon substrate 102 of 10 Ωcm. A three and a half turn circular spiral transformer 104 with metal trace width of 10 μm, a spacing of 2 μm and an inner diameter of 100 μm (total size: about 270×270 μm$^2$) is formed on the substrate 102 (FIG. 1 (b)). The transformer metal traces 106 are formed by a top metal layer of 2 μm thickness, and two embedded metal layers on the substrate 102 are stacked together with a dense resistive via array 108 to form an underpass.

Figure 2:
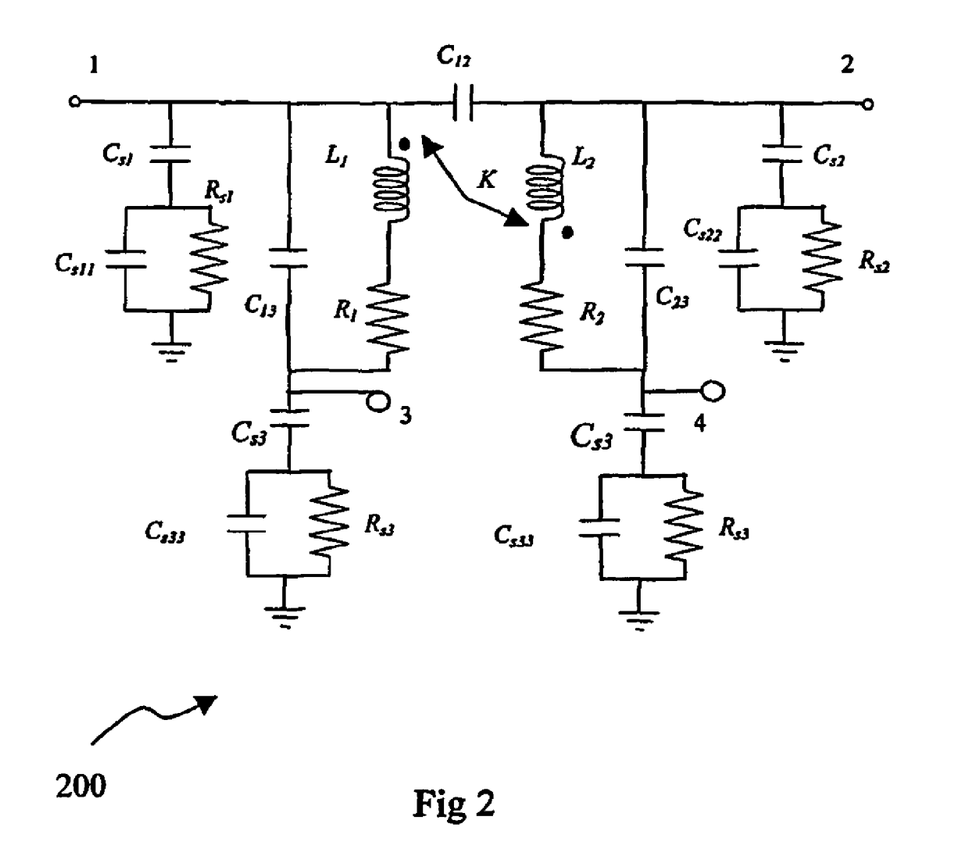
FIG. 2 shows the on-chip transformer equivalent circuit for the oscillator of FIG. 1.

The input and output ports 112, 114 of the transformer 104 are connected to respective ground-signal-ground (GSG) pads 116. A ground guard-ring structure 118 is laid out for better grounding. The equivalent circuit 200 for the on-chip transformer 104 is presented in FIG. 2. The circuit 200 consists of three parts: I) self-inductances, self-resistances (L1, L2, R1, R2); II) coupling capacitances (C12, C13, C23); and III) substrate effect parasitics, including oxide capacitances (Cs1, Cs2, Cs3), substrate capacitances (Cs11, Cs22, Cs33) and substrate resistances (Rs1, Rs2, Rs3). The mutual inductance between the metal traces is described by parameter K. Accurate parameters of the transformer circuit 200 model can be easily extracted from measured S-parameters. The feedback topology is chosen for a power oscillator design.

Returning to FIG. 1(b), the on-chip transformer 104 is used as a RF signal feedback and bias supply paths between the drain 119 and gate 120 of a power transistor 122 to reduce substrate coupling and resistance loss to achieve a high efficiency. Ports 117, 121 of the primary and secondary sides of the on-chip transformer 104 are connected to the drain 119 and the gate 120 of the CMOS power transistor 122, respectively. The ports 114, 112 are connected to capacitors 128, 130 respectively for RF grounding, as well as for drain and gate bias feeding, respectively. The output port of the power oscillator 100 is from the RF terminal 132 connected to the drain 119 via capacitor 134.

For considerations of the circuit design, the size of the transistor 122 and the number of turns of the transformer 104 determines the oscillating carrier frequency, as the transformer provides a feedback path that forms a resonant loop for the desired oscillating carrier frequency. The size of the transistor 122 also determines the RF output power level (calculation based on transistor $P_{outmax}$<about 0.1 W/mm and efficiency), with a larger size transistor 122 providing more power gain to the oscillator 100, while the operating carrier frequency decreases due to a higher $C_{gs}$. Therefore, the output power and operating frequency are a trade-off between dimensions of the transformer 104 and the size of the transistor 122.

Figure 3:
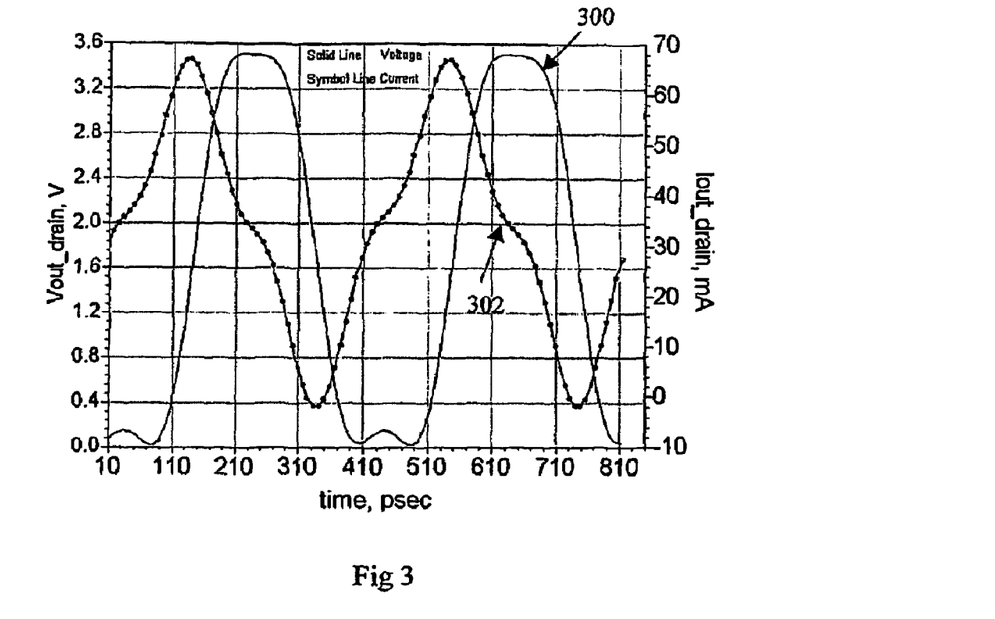
FIG. 3 is a graph showing the simulated waveforms of the output voltage and current for the oscillator of FIG. 1.

An NMOS transistor 122 with gate length of 0.18 μm and total width of 550 μm is used for the power oscillator 100. The transistor RF model is created using a Bsim3 model for simulation together with extracted substrate and gate network parameters. Simulation was carried out using extracted RF models of the transistor 122, the transformer 104 and the capacitors 128, 130, 134. The waveforms of the output voltage (curve 300) and current (curve 302) are shown in FIG. 3. The voltage waveform (curve 300) shows that the circuit operates in Class-E mode. The carrier frequency is at about 2.45 GHz with an output power of 15.5 dBm and a phase noise of about −122 dBc/Hz at 100 kHz offset at $V_{ds}$=1.8 V and $I_{ds}$=29.8 mA.

Figure 4:
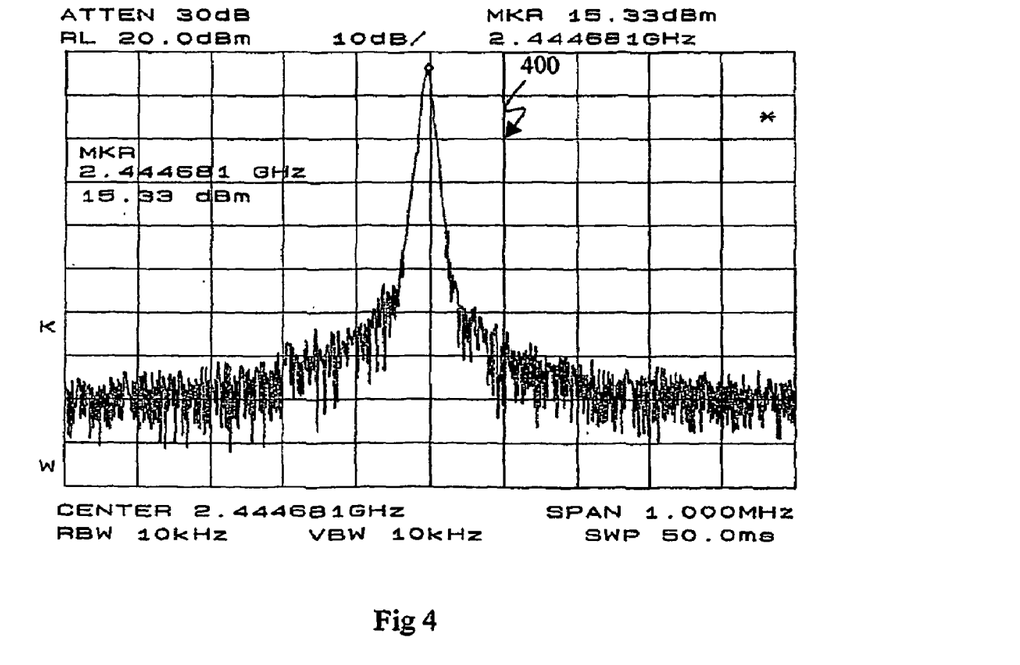
FIG. 4 shows a measured output spectrum of the oscillator of FIG. 1.

The fabricated oscillator 100 with a die size of 0.6×0.7 mm with the GSG test pad 116, was also measured using a HP 8563E spectrum analyzer with phase noise measurement option and battery power supply. The oscillator 100 was placed in a small shielded chamber during the measurements. The measured results shown in FIG. 4 demonstrate that the output power is about 15.3 dBm with a phase noise of about −113 dBc/Hz at 100 kHz offset from a carrier frequency of about 2.446 GHz at $V_{ds}$=1.8 V and $I_{ds}$=28.7 mA.

Figure 5:
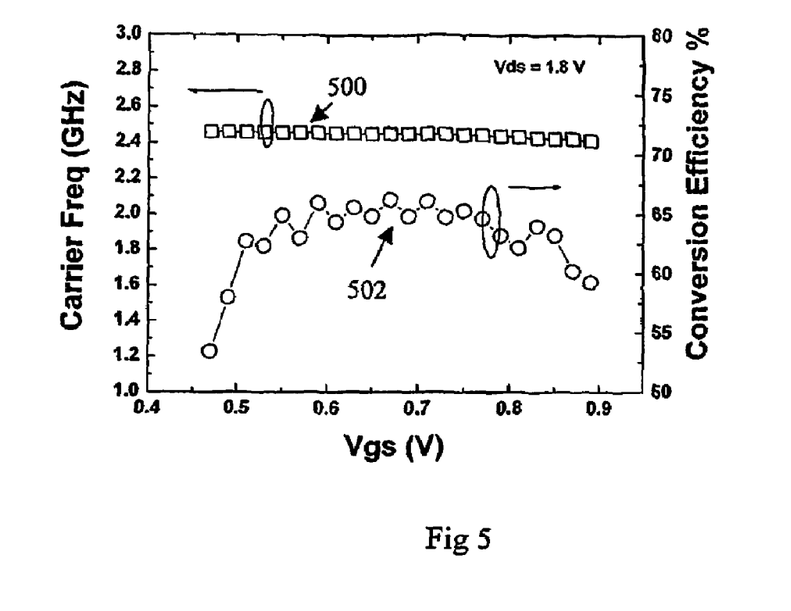
FIG. 5 shows the carrier frequency and DC-to-RF conversion efficiency as a function of gate voltage for the oscillator of FIG. 1.

The carrier frequency (curve 500) and DC-to-RF conversion efficiency (curve 502) as a function of gate voltage were also measured and are shown in FIG. 5. The results show that the carrier frequency drifts down slightly while the gate voltage increases from 0.47 to 0.89 V, and the peak efficiency of the DC-to-RF conversion of about 66% occurs at $V_{gs}$=0.71 V. This is believed to be due to the increase in transconductance, $g_m$, resulting in an increase in feedback power level while the gate voltage increases. The nonlinear part in the output spectrum, especially the third-harmonic signal, will reduce the carrier output power at higher gate voltages, as the gate voltage increases, and the increase in gate capacitance induces a decrease in carrier frequency. Further increase in gate voltage results in multi-oscillating frequencies.

Returning now to FIG. 1(b), the oscillator 100 can be used as a Class E power amplified type circuit with the oscillator in switching mode, and exhibits low phase noise, high efficiency and high power. The transformer 104 is used to generate a feedback path to meet the oscillation loop requirement: loop-phase equal to 360° and amplitude is greater than 1, while the transistor 122 provides the loop power gain and part of the loop phase shift. This results in a Class E power amplified type circuit with very low phase noise.

Figure 6:
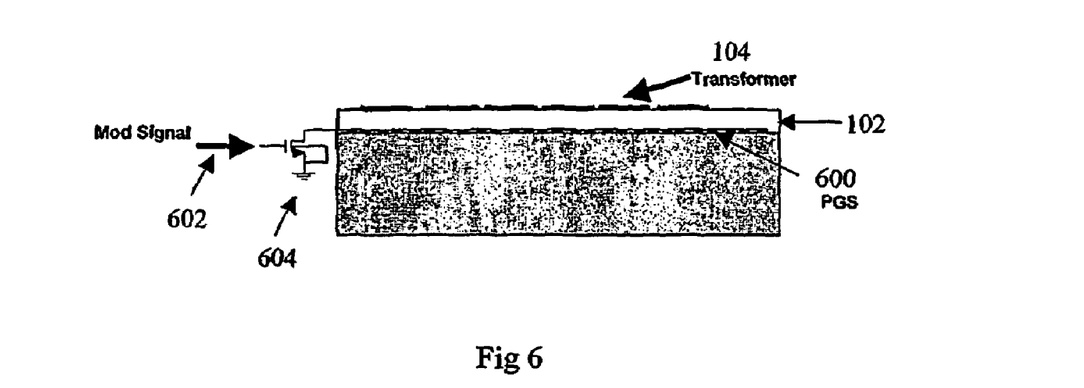
FIG. 6 shows a schematic cross-sectional view of the transformer of FIG. 1.

The oscillator 100 can be modulated by feeding a modulating signal to a Patterned Ground Shield (PGS) layer 600 of the substrate 102 (visible through transparent oxide layers of the substrate 102) which affects the transformer 104 on the top layer, thus forming an oscillator with modulation. PGS layers are typically used for isolating a circuit on top of a substrate from the rest of the substrate and around the circuit. FIG. 6 shows a schematic cross-sectional view of the transformer 104, illustrating the location of the PGS layer 600 underneath the transformer 104. The modulation signal 602 is provided to the PGS layer 600 via a transistor 604. The modulation signal 602 is utilized to modulate the gate of the transistor 604 and to modulate the channel resistance. While the channel resistance is very high, the PGS layer 600 behaves as a floating metal layer, and while the channel resistance is very low, the PGS layer 600 behaves as if it is connected to ground. Due to the proximity of the PGS layer 600 to the transformer 104, the modulation signal 602 will modulate the distance between the transformer 104 and ground 606 to change the capacitance between the transformer 104 and the substrate 102, which in turn modulates the effective inductance of the transformer 104.

Figure 7:
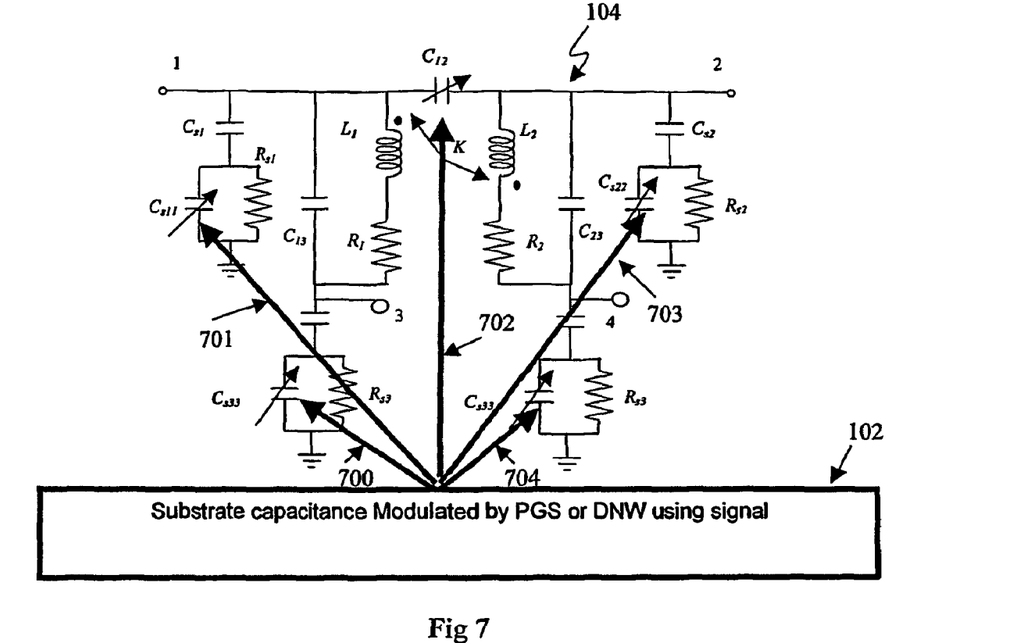
FIG. 7 shows a schematic circuit diagram illustrating modulation of the capacitance of the transformer to the chip-substrate of the oscillator of FIG. 1.
Figure 8:
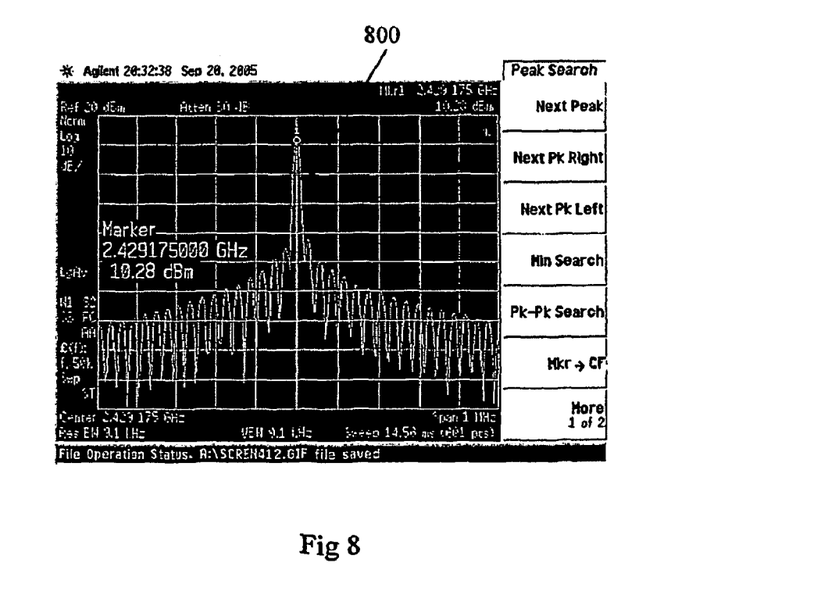
FIG. 8 shows a FM signal spectrum for the oscillator of FIG. 1.

The PGS layer 600 can be set to floating or grounding to modulate the capacitance of the transformer 104 to the substrate 102. The effective inductance of the transformer 104 is modulated by the modulating signal 602 and the carrier frequency of the oscillator 100 is thus modulated by the modulating signal. FIG. 7 is a schematic circuit diagram illustrating the influence of the modulated capacitance of the transformer 104 to the substrate 102, indicated as arrows 700 to 704 in FIG. 7. FIG. 8 shows an FM signal spectrum 800 for a modulating signal having a pulse frequency of about 30 kHz and width of about 900 ns, and a modulated voltage of about 0.7V while the drain voltage is about 1.5V and the gate voltage is about 0.7V.

Figure 9:
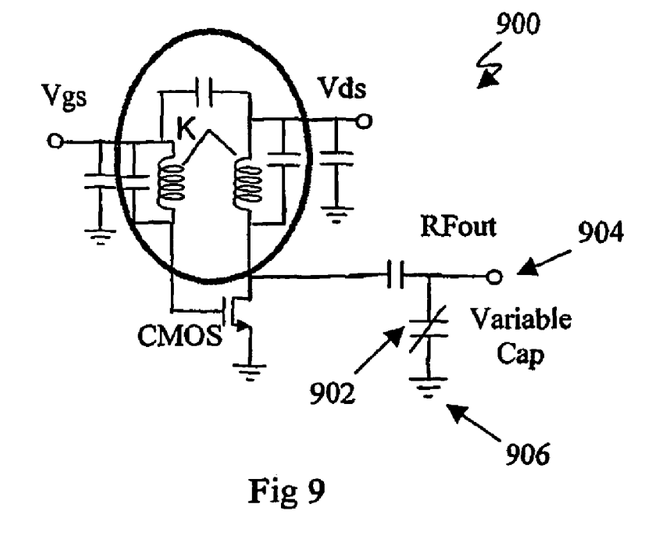
FIGS. 9 shows a circuit schematic of a CMOS process technology VCO with FM modulation.
Figure 10:
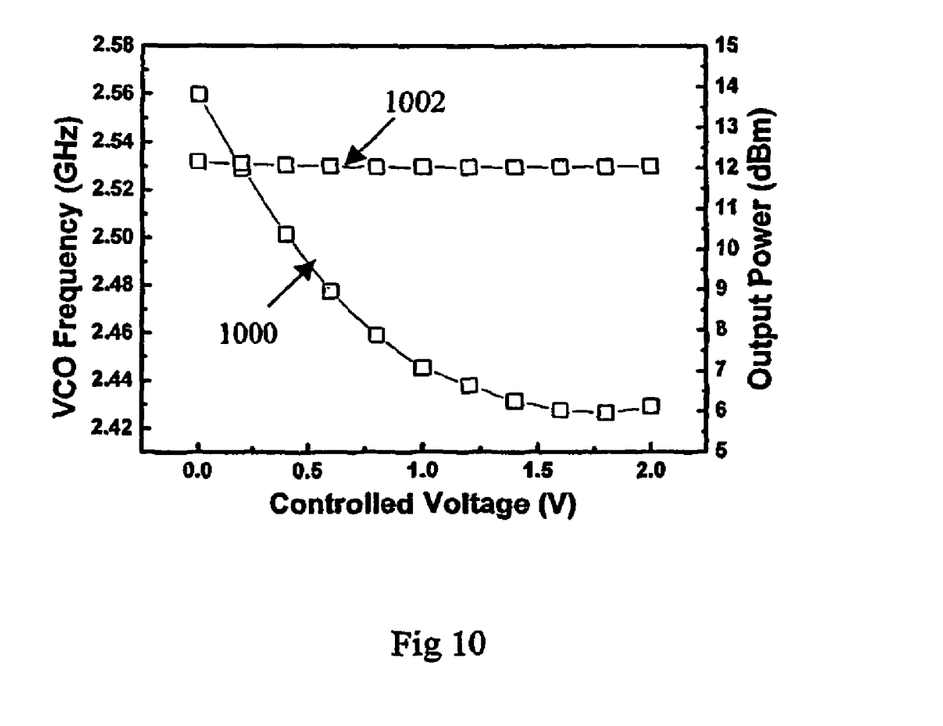
FIG. 10 shows the simulated frequency and output power as a function of controlled voltage of the VCO of FIG. 9.

FIG. 9 shows a circuit schematic of a CMOS process technology VCO structure 900 with FM modulation, which is a modification of the oscillator structure 100 of FIG. 1(a). The modification consists of connecting a variable capacitor in the form of a MOS varactor 902 between the RF output 904 and the RF ground 906. FIG. 10 shows the simulated frequency (curve 1000) and output power (curve 1002) respectively as a function of the controlled voltage applied to the MOS varactor (compare 902 in FIG. 9). FIG. 10 demonstrates that the circuit can function as a VCO. Further simulations showed that if the variable capacitor (compare 902 in FIG. 9) changes from 0.1 pf to 4 pf, the oscillating frequency changes from about 2.45 GHz to about 1.39 GHz, with the drain voltage at about 1.5V and the gate voltage at about 0.7V.

Figure 11:
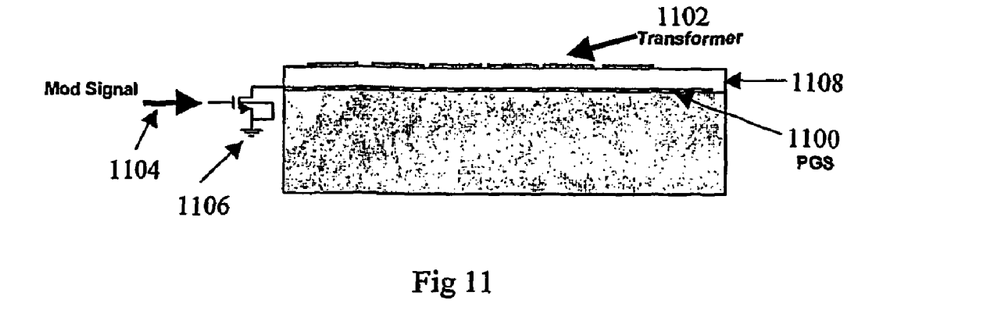
FIG. 11 shows a schematic cross-sectional view of the transformer of FIG. 9.
Figure 12:
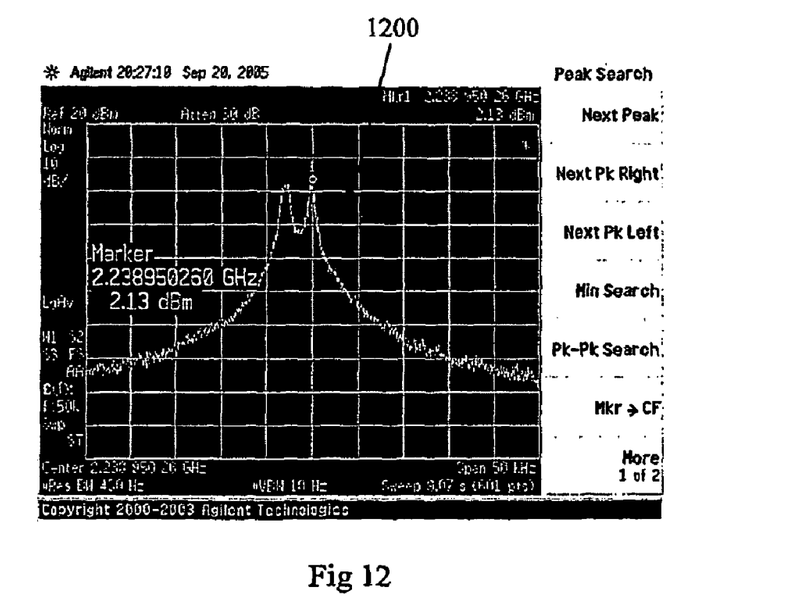
FIG. 12 shows a FM signal spectrum for the VCO of FIG. 9.

The VCO can again be modulated by feeding a modulating signal to a Patterned Ground Shield (PGS) layer of the substrate which affects the transformer, thus forming a VCO with modulation. FIG. 11 shows a schematic cross-sectional view of the transformer 1102, illustrating the location of the PGS layer 1100 underneath the transformer 1102. The modulation signal 1104 is provided to the PGS layer 1100 via a transistor structure 1106. The PGS layer 1100 can be set to floating or grounding to modulate the capacitance of the transformer 1102 to the substrate 1108. The effective inductance of the transformer 1102 is modulated by the modulating signal 1104 and the carrier frequency of the VCO 900 is thus modulated by the modulating signal. FIG. 12 shows a frequency modulated (FM) signal spectrum 1200 with a modulation signal frequency of about 200 Hz and amplitude about 1V with an offset of about 0.5V, while the drain voltage is about 1.5V and the gate voltage is about 0.7V.

Figure 13:
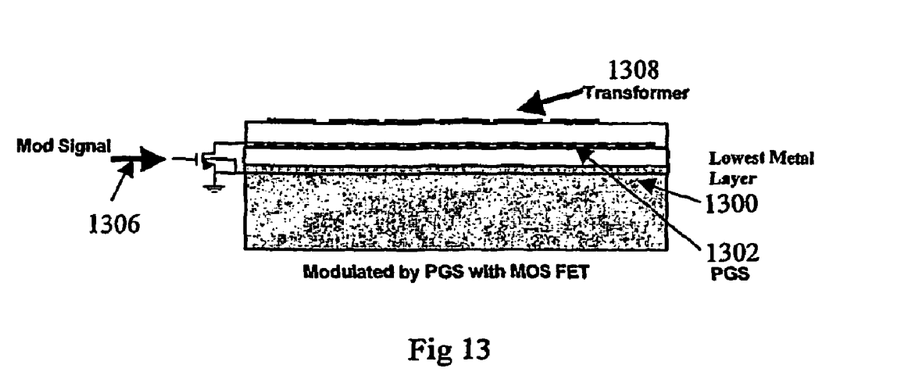
FIG. 13 shows a schematic cross-sectional view of a transformer with PGS metals for FM modulation.
Figure 14:
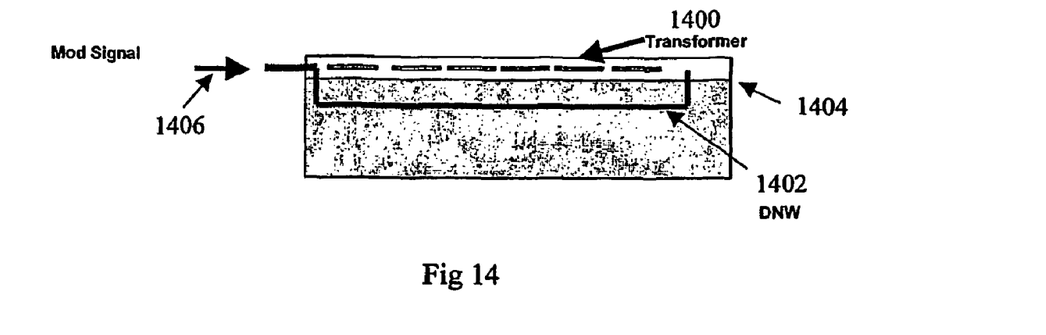
FIG. 14 shows a schematic cross-sectional view of a transformer with deep N-well for FM modulation.

In another arrangement illustrated in FIG. 13, an additional metal layer 1300 may be provided in conjunction with a PGS layer 1302 for providing electrical isolation, since the PGS layer 1300 is being used for the modulating signal 1306. This arrangement is suitable for applications where isolation of the oscillator or VCO circuit, represented by transformer 1308, is important. As shown in FIG. 14, in another arrangement, an oscillator or VCO circuit, represented by transformer 1400, can be modulated by utilizing a deep N-well (DNVV) 1402 within a substrate 1404 to control the oscillator or VCO. In this embodiment, a modulation signal 1406 is directly provided to the deep N-well 1402, which operates as a P-N junction. The modulation signal 1406 modulates the P-N junction capacitance and resistance, which in turn modulates the substrate 1404 capacitance and resistance and thus the transformer 1400 to substrate 1404 capacitance and resistance. The P-N junction is formed between N-well 1402 and the P-type substrate 1404, with the P-type substrate providing grounding.

Figure 15:
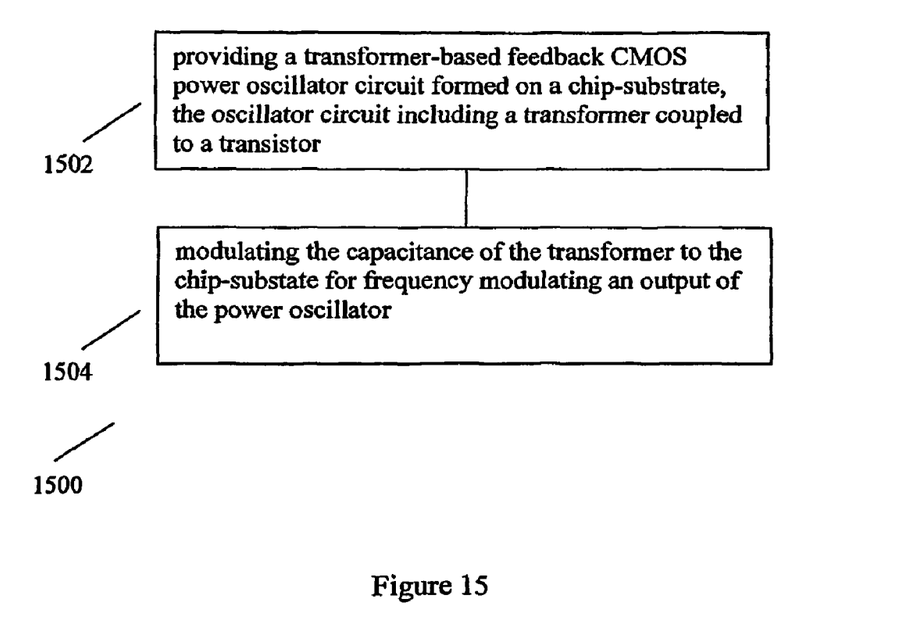
FIG. 15 shows a flowchart illustrating a method of frequency modulating a CMOS power oscillator.

FIG. 15 shows a flowchart 1500 illustrating a method of frequency modulating a CMOS power oscillator. At step 1502, a transformer-based feedback CMOS power oscillator circuit formed on a chip-substrate is provided, the oscillator circuit including a transformer coupled to a transistor. At step 1504, the capacitance of the transformer to the chip-substrate is modulated for frequency modulating an output of the power oscillator.

The combination of a CMOS oscillator or VCO with a method of modulating the oscillator or VCO in the described arrangements can result in a device that is suitable for small applications due to fewer components being used compared to existing devices, with high power, high efficiency and low phase noise. The overall size is reduced due to utilising the CMOS-based combination of a power amplifier, oscillator and modulator. The device is cost effective and can be used in e.g. simple transceiver applications as well as remote controls and Bluetooth applications.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

The invention claimed is:

1. A CMOS power oscillator comprising:
    a transformer-based feedback CMOS power oscillator circuit formed on a chip-substrate, the oscillator circuit including a transformer coupled to a transistor;
    means for modulating the capacitance of the transformer to the chip-substrate for frequency modulating an output of the power oscillator.

2. The power oscillator as claimed in claim 1 wherein the means for modulating comprises a patterned ground shield (PGS) layer formed in the chip-substrate and coupled to an input circuit for receiving a modulating signal.

3. The power oscillator as claimed in claim 2, further comprising a conducting layer formed in the chip-substrate for shielding the PGS layer and the transformer.

4. The power oscillator as claimed in claim 3, wherein the input circuit comprises a MOS FET.

5. The power oscillator as claimed in claim 3, wherein the modulating signal alternately sets the PGS to floating and to grounding for modulating the capacitance of the transformer to the chip-substrate for frequency modulating an output of the power oscillator.

6. The power oscillator as claimed in claim 2, wherein the input circuit comprises a MOS FET.

7. The power oscillator as claimed in claim 6, wherein the modulating signal alternately sets the PGS to floating and to grounding for modulating the capacitance of the transformer to the chip-substrate for frequency modulating an output of the power oscillator.

8. The power oscillator as claimed in claim 2, wherein the modulating signal alternately sets the PGS to floating and to grounding for modulating the capacitance of the transformer to the chip-substrate for frequency modulating an output of the power oscillator.

9. The power oscillator as claimed in claim 1 wherein the means for modulating comprises a deep N-well formed in the chip-substrate and coupled to an input circuit for receiving of a modulating signal.

10. The power oscillator as claimed in claim 9, wherein the deep N-well comprises a p-n junction.

11. The power oscillator as claimed in claim 10, wherein the modulating signal alternates the p-n junction capacitance and resistance for modulating the capacitance of the transformer to the chip-substrate for frequency modulating an output of the power oscillator.

12. The power oscillator as claimed in claim 1, wherein the oscillator circuit further includes a variable capacitance coupled between an output terminal of the power oscillator and ground for varying an output carrier frequency of the power oscillator.

13. The power oscillator as claimed in claim 12, wherein the variable capacitor comprises a varactor for implementing a voltage controlled oscillator (VCO) with frequency modulation capabilities.

14. The power oscillator as claimed in claim 1, wherein the transformer provides a feedback path between the drain and the gate of the transistor.

15. The power oscillator as claimed in claim 1, wherein a first port of the transformer is connected for RF grounding and drain bias feeding, and a second port of the transformer is connected for RF grounding and gate bias feeding.

16. The power oscillator as claimed in claim 1, wherein a third port of the transformer is connected to the drain of the transistor, and a fourth port of the transformer is connected to the gate of the transistor.

17. The power oscillator as claimed in claim 1, wherein parameters of the transistor and parameters of the transformer are chosen to pre-set the output carrier frequency of the power oscillator.

* * * * *